United States Patent
Kawamura et al.

(10) Patent No.: US 11,302,550 B2
(45) Date of Patent: Apr. 12, 2022

(54) TRANSFER METHOD

(71) Applicant: Tokyo Electron Limited, Tokyo (JP)

(72) Inventors: Yohei Kawamura, Yamanashi (JP); Keiji Osada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/581,607

(22) Filed: Sep. 24, 2019

(65) Prior Publication Data

US 2020/0105564 A1    Apr. 2, 2020

(30) Foreign Application Priority Data

Sep. 28, 2018   (JP) .............................. JP2018-184353

(51) Int. Cl.
*H01L 21/677*    (2006.01)
*H01L 21/67*     (2006.01)

(52) U.S. Cl.
CPC .. *H01L 21/67742* (2013.01); *H01L 21/67167* (2013.01); *H01L 21/67248* (2013.01); *H01L 21/67745* (2013.01); *H01L 21/67196* (2013.01); *H01L 21/67201* (2013.01)

(58) Field of Classification Search
CPC ......... H01L 21/67167; H01L 21/67248; H01L 21/67742; H01L 21/67745
See application file for complete search history.

(56) References Cited

U.S. PATENT DOCUMENTS

| | | | | |
|---|---|---|---|---|
| 6,802,934 | B2 * | 10/2004 | Saeki ............... | H01L 21/67167 118/719 |
| 9,870,964 | B1 * | 1/2018 | Yoshino ............. | H01L 21/6838 |
| 10,403,525 | B2 * | 9/2019 | Nishino ........... | G05B 19/41865 |

FOREIGN PATENT DOCUMENTS

| | | |
|---|---|---|
| JP | 2011-205044 A | 10/2011 |
| KR | 10-2006-0081377 A | 7/2006 |
| KR | 10-2018-0035108 A | 4/2018 |

* cited by examiner

*Primary Examiner* — James Keenan
(74) *Attorney, Agent, or Firm* — Fenwick & West LLP

(57) ABSTRACT

In a transfer method used in a substrate processing apparatus including a vacuum transfer chamber and a first and a second processing chamber and a preliminary chamber connected to the vacuum transfer chamber, a first and a second processing chamber are heated such that a temperature of the first processing chamber becomes lower than a temperature of the second processing chamber. A processed substrate is transferred from the first processing chamber to the second processing chamber and an unprocessed substrate is transferred from the preliminary chamber to the first processing chamber using a substrate transfer device disposed in the vacuum transfer chamber. Further, the transfer of the processed substrate and the transfer of the unprocessed substrate are repeatedly executed for each of substrates, and the transfer of the unprocessed substrate is executed when no substrate is mounted in the first processing chamber.

9 Claims, 3 Drawing Sheets

TRANSFER METHOD

CROSS-REFERENCE TO RELATED APPLICATION

This application claims priority to Japanese Patent Application No. 2018-184353, filed on Sep. 28, 2018, the entire contents of which are incorporated herein by reference.

TECHNICAL FIELD

The present disclosure relates to a transfer method.

BACKGROUND

For example, Japanese Patent Application Publication No. 2011-205044 discloses a cluster-type substrate processing apparatus in which a plurality of processing chambers is connected to a vacuum transfer chamber. The substrate processing apparatus includes a substrate transfer device for transferring substrates to the vacuum transfer chamber. The substrates are transferred to and from the processing chambers by two arms of the substrate transfer device.

The present disclosure provides a technique capable of suppressing the effect of heat on an unprocessed substrate during transfer of the substrates.

SUMMARY

In accordance with an aspect of the present disclosure, there is provided a transfer method used in a substrate processing apparatus, wherein the substrate processing apparatus includes a vacuum transfer chamber maintained in a vacuum state, a first processing chamber, a second processing chamber and a preliminary chamber that are connected to the vacuum transfer chamber, and a substrate transfer device disposed in the vacuum transfer chamber to transfer substrates between the first processing chamber, the second processing chamber, and the preliminary chamber, and the transfer method repeatedly performs a process of transferring each of the substrates unloaded from the preliminary chamber sequentially and consecutively to the first processing chamber and the second processing chamber, the transfer method including: a first step of heating the first processing chamber and the second processing chamber such that a temperature of the first processing chamber becomes lower than a temperature of the second processing chamber; a second step of transferring a processed substrate from the first processing chamber to the second processing chamber using the substrate transfer device; and a third step of transferring an unprocessed substrate from the preliminary chamber to the first processing chamber using the substrate transfer device. The second step and the third step are repeatedly executed for each of the substrates, and the third step is executed when no substrate is mounted in the first processing chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
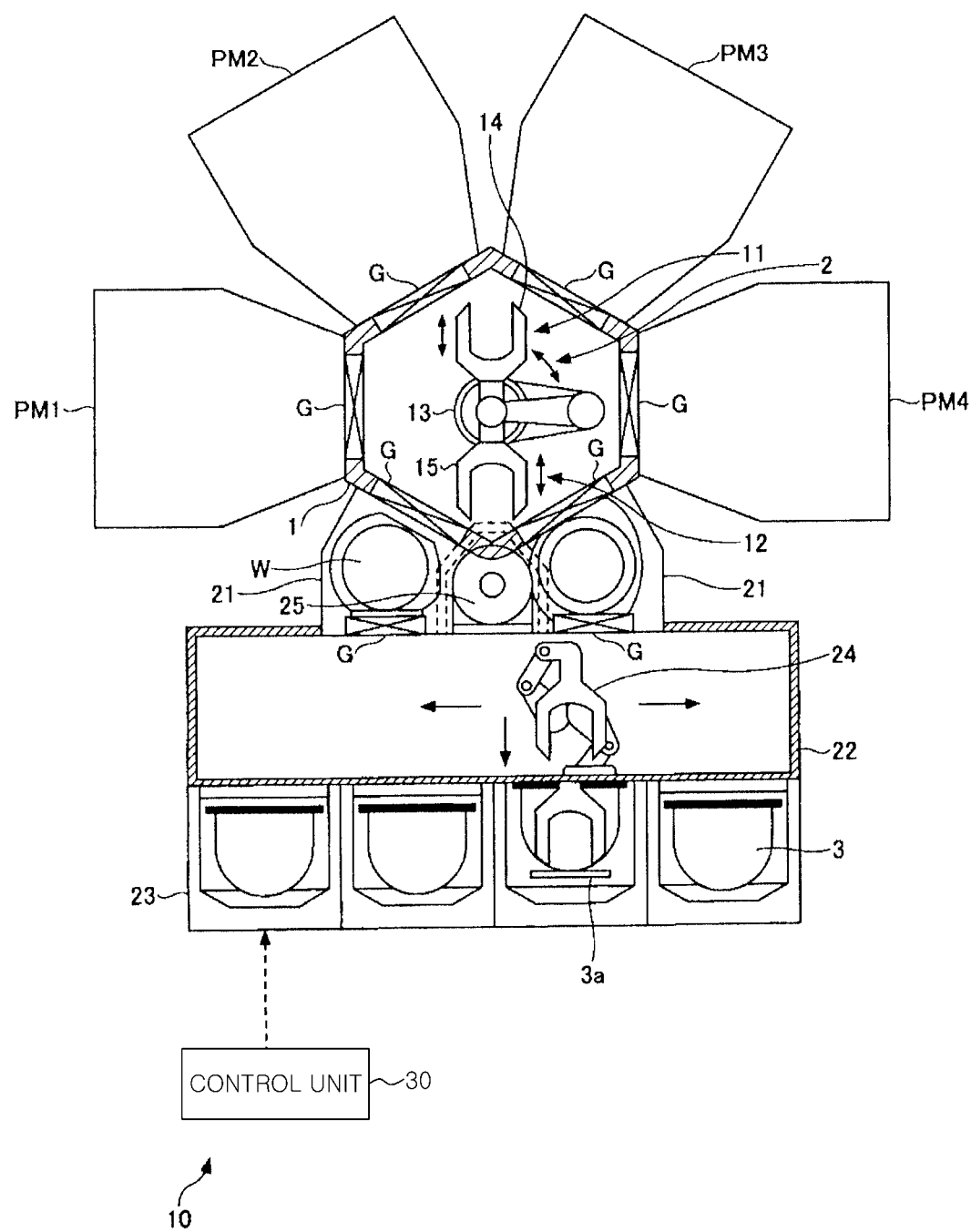
FIG. 1 shows an example of a substrate processing apparatus according to an embodiment.

Hereinafter, embodiments will be described in detail with reference to the accompanying drawings. Like reference numerals will be given to like or corresponding parts throughout the drawings, and redundant description thereof will be omitted.

Configuration of Substrate Processing Apparatus

First, a substrate processing apparatus 10 according to an embodiment of the present disclosure will be described with reference to FIG. 1. FIG. 1 shows an example of a substrate processing apparatus 10 according to an embodiment. The substrate processing apparatus 10 includes a vacuum transfer chamber 1 maintained in a vacuum state and configured to transfer a wafer W serving as a substrate and maintained in a vacuum state, and a plurality of processing modules connected hermetically to the vacuum transfer chamber 1 and configured to perform predetermined processings on the wafer W. In this example, four processing modules are provided. However, the number of processing modules is not limited thereto and two or more processing modules may be provided. Hereinafter, the four processing modules will be individually referred to as "processing chambers PM1, PM2, PM3, and PM4" and collectively referred to as "processing chambers PM". In the present embodiment, the processing chamber PM1 is an example of a first processing chamber, and the processing chamber PM4 is an example of a second processing chamber. The four processing chambers PM1 to PM4 and two load-lock chambers 21 are connected to sides of a hexagonal vacuum transfer chamber 1.

In the processing chamber PM1, the predetermined processing is performed on the wafer W in a state where the processing chamber PM1 is heated to a predetermined temperature of, e.g., about 30° C. (normal temperature range). In the processing chamber PM4, the predetermined processing is performed on the wafer W in a state where the processing chamber PM4 is heated to a predetermined temperature in a range of, e.g., 150° C. to 200° C., which is higher than the temperature of the processing chamber PM1. Hereinafter, the processing performed in the processing chamber PM1 will be referred to as "low-temperature processing," and the processing performed in the processing chamber PM4 will be referred to as "high-temperature processing."

For example, the processing chamber PM1 may be a chemical oxide removal (COR) processing chamber, and the processing chamber PM4 may be a post heat treatment (PHT) processing chamber. In this case, the low-temperature processing performed in the processing chamber PM1 may be a process for chemically reacting foreign substances adhered to a silicon wafer W, e.g., an oxide film such as a natural oxide film or the like, with gas molecules, e.g., ammonia ($NH_3$) gas, hydrogen fluoride (HF) gas, or the like. In this case, $(NH_4)_2SiF_6$ is mainly produced as a by-product. The high-temperature processing performed in the processing chamber PM4 may be a process for heating a wafer W on which the COR processing has been performed to vaporize (sublimate) and remove the by-products generated on the wafer W due to the chemical reaction of the COR processing.

However, the low-temperature processing performed in the processing chamber PM1 and the high-temperature processing performed in the processing chamber PM4 are not limited thereto. For example, the high-temperature processing performed in the processing chamber PM4 may be dry etching or ashing using plasma, and the high-temperature processing may be film formation or annealing using thermal chemical vapor deposition (CVD) or atomic layer deposition (ALD). In addition, the high-temperature processing may be a moisture removal process for removing moisture contained in the wafer W by heating the wafer W to, e.g., about 200° C. Each of the processing chamber PM1 and the processing chamber PM4 includes a mounting table for mounting thereon the wafer W, a gas supply line for supplying a processing gas into the chamber, a gas exhaust line for evacuating the chamber, and the like. In the processing chambers PM2 and PM3, film formation, dry etching, ashing, cleaning, or the like may be performed on the wafer W that has been processed in the processing chamber PM4.

A substrate transfer device 2 is disposed in the vacuum transfer chamber 1. The substrate transfer device 2 has two transfer arms, i.e., a first transfer arm 11 and a second transfer arm 12, and holds and transfers the wafer(s) W by one or both of the two transfer arms.

The first transfer arm 11 and the second transfer arm 12 are configured to be vertically movable and rotatable by a rotation mechanism 13 disposed on a bottom surface of the vacuum transfer chamber 1. The first transfer arm 11 and the second transfer arm 12 are rotated about an axis coaxial with the rotation mechanism 13. U-shaped picks 14 and 15 for holding the wafer W are formed at the leading ends of the first transfer arm 11 and the second transfer arm 12, respectively. The picks 14 and 15 are configured to individually reciprocate with respect to the processing chambers PM1 to PM4 and the two load-lock chambers 21 in a horizontal direction.

For example, the first transfer arm 11 and the second transfer arm 12 are connected to the rotation mechanism 13 such that the traveling directions when extending from the rotation mechanism 13 are opposite to each other. The wafer W is transferred between the processing chambers PM and the load-lock chambers 21 by the cooperation of the reciprocation and the vertical movement of the first transfer arm 11 and the second transfer arm 12 and the vertical movement of lift pins disposed at the mounting table for mounting thereon the wafer W in each processing chamber PM.

The load-lock chambers 21 are hermetically connected to the vacuum transfer chamber 1 and an inner atmosphere thereof can be switched between a vacuum atmosphere and an atmospheric atmosphere. In the present embodiment, two load-lock chambers 21 are provided. However, the number of load-lock chambers 21 is not limited thereto.

The two load-lock chambers 21 are hermetically connected to a common atmospheric transfer chamber 22 for transferring the wafer W under an atmospheric atmosphere. In the atmospheric transfer chamber 22, a mounting table of a load port 23 for mounting thereon a FOUP 3 accommodating therein, e.g., 25 wafers, is disposed at multiple locations. In the present embodiment, the mounting tables are disposed at four locations. However, the number of mounting tables is not limited thereto. A pressing mechanism 3a is configured to press the FOUP 3 on the mounting table toward the atmospheric transfer chamber 22 side.

An atmospheric transfer arm 24 configured to be rotatable about a vertical axis and movable in parallel with the load ports 23 arranged in a longitudinal direction of the atmospheric transfer chamber 22 is disposed in the atmospheric transfer chamber 22 to transfer the wafer W between the load-lock chambers 21 and the FOUPs 3. An alignment mechanism 25 for aligning the wafer W is disposed between the two load-lock chambers 21.

Gate valves G are disposed between the vacuum transfer chamber 1 and the processing chambers PM1 to PM4, between the vacuum transfer chamber 1 and the load-lock chambers 21, and between the load-lock chambers 21 and the atmospheric transfer chamber 22. The wafer W is transferred in an airtight manner by opening and closing the gate valves G.

The substrate processing apparatus 10 configured as described above includes a control unit 30 having, e.g., a computer. The control unit 30 controls the entire substrate processing apparatus 10. The control unit 30 includes a memory and a CPU. Programs and recipes used for performing processing in each processing chamber PM are stored in the memory. The programs include a program related to input and display of processing parameters. In the recipe, processing conditions such as a heating temperature of the processing chamber PM or the like, a processing procedure, and a transfer path for the wafer W are set.

The CPU executes the transfer of the wafer W taken out from the FOUP 3 to the processing chambers PM using the atmospheric transfer arm 24, the first transfer arm 11, and the second transfer arm 12 along a predetermined path based on the program and the recipe stored in the memory. Further, the CPU performs predetermined processing in each processing chamber PM based on the processing conditions set in the recipe. The program may be stored in a storage unit such as a computer storage medium, e.g., a flexible disk, a compact disk, a hard disk, a magneto-optical (MO) disk or the like. The program may be installed in the control unit 30 or may be downloaded through a wired/wireless communication.

An unprocessed wafer W taken out from the FOUP 3 is transferred to the load-lock chamber 21 by the atmospheric transfer arm 24. Next, the unprocessed wafer W is transferred in the order of "the load-lock chamber 21→the substrate transfer device 2→the processing chamber PM1" using the first transfer arm 11 or the second transfer arm 12, and then subjected to the low-temperature processing in the processing chamber PM1. Thereafter, the wafer W is transferred in the order of "the processing chamber PM1→the substrate transfer device 2→the processing chamber PM4," and then subjected to the high-temperature processing in the processing chamber PM4. Next, the wafer W is transferred in the order of "the processing chamber PM4→the substrate transfer device 2→the processing chamber PM2 or the processing chamber PM3→the substrate transfer device 2→the load-lock chamber 21," and then subjected to film formation in the processing chamber PM2 or the processing chamber PM3. Then, the wafer W is returned to the FOUP 3.

As described above, the wafers W unloaded from the load-lock chamber 21 are sequentially and consecutively transferred to the processing chamber PM1 and the processing chamber PM4. Then, the wafers W are repeatedly subjected to processing in the processing chambers PM1 and PM4. The sequential and consecutive transfer of the wafers W to two or more different processing chambers PM is referred to as "serial transfer." The load-lock chamber 21 is an example of a preliminary chamber. The processing chamber PM1 is an example of a first processing chamber into which the wafer W unloaded from the preliminary chamber is loaded. The processing chamber PM4 is an example of a second processing chamber into which the wafer unloaded from the first processing chamber is loaded.

The wafer W unloaded from the load-lock chamber 21 is subjected to the low-temperature processing in the first processing chamber PM1. In a conventional transfer method, one of the first transfer arm 11 and the second transfer arm 12 unloads a next unprocessed wafer W from the load-lock chamber 21 and waits in front of the processing chamber PM1 in the vacuum transfer chamber 1 while holding the next unprocessed wafer W during processing of the previous wafer W in the processing chamber PM1.

Conventionally, when the processing of the previous wafer W is completed in the processing chamber PM1, the other one of the first transfer arm 11 and the second transfer arm 12 enters the processing chamber PM1 and unloads the processed wafer W from the processing chamber PM1. Then, a next unprocessed wafer W in a standby state is immediately transferred to the processing chamber PM1. As described above, in the conventional transfer method, the wafer W processed in the processing chamber PM1 and the wafer W to be processed in the processing chamber PM1 are exchanged by unloading the processed wafer W from the processing chamber PM1 using one of the two transfer arms and loading the unprocessed wafer W into the processing chamber PM1 using the other transfer arm. Accordingly, the wafers W can be efficiently transferred, and the transfer time can be shortened.

However, in the conventional transfer method, in a state where one of the transfer arms holds the unprocessed wafer W, the other transfer arm enters the low-temperature processing chamber PM1. The transfer arm holding the unprocessed wafer W receives heat, for example, from the processing chamber PM4 having a temperature of, e.g., about 200° C., due to the consecutive transfer sequence. The transfer arm also receives heat from a processed wafer W being transferred by the transfer arm due to the processed wafer W having a high temperature after being processed in the processing chamber PM4.

Since the first transfer arm 11 and the second transfer arm 12 transfer the wafers W consecutively, the temperatures of the first transfer arm 11 and the second transfer arm 11 increase due to the heat inputted from the processing chamber PM4 and the high-temperature wafer W. In the conventional transfer method, the first transfer arm 11 or the second transfer arm 12 having a high temperature waits in front of the processing chamber PM1 while holding the unprocessed wafer W. Therefore, the heat is transferred from the first transfer arm 11 or the second transfer arm 12 to the unprocessed wafer W during the standby state, and the processing results of the unprocessed wafer W may be affected by the heat transfer.

In view of the above, the transfer method of the present embodiment minimizes a period of time in which the unprocessed wafer W is held on the first transfer arm 11 or the second transfer arm 12 in order to minimize the effect of the heat on the unprocessed wafer W.

Specifically, in the present embodiment, when there is a wafer W in the first processing chamber PM1, an unprocessed wafer W waits in the load-lock chamber 21 without being transferred from the load-lock chamber 21 to the vacuum transfer chamber 1.

On the other hand, when there is no wafer W in the first processing chamber PM1, the unprocessed wafer W is transferred from the load-lock chamber 21 to the processing chamber PM1. In the above manner, the period of time in which the unprocessed wafer W is held on the first transfer arm 11 or the second transfer arm 12 can be minimized. Accordingly, the heat transferred from the first transfer arm 11 and the second transfer arm 12 to the unprocessed wafer W can be minimized. As a result, it is possible to minimize the effect of the heat on the processing results (uniformity of a film, resistance value of the wafer W, and the like) of the unprocessed wafer W.

Next, a specific example of the serial transfer according to the embodiment will be described with reference to FIGS. 2A to 2C. Here, the wafer W is transferred in the order of "the FOUP3→the load-lock chamber 21→the vacuum transfer chamber 1→the processing chamber PM1→the vacuum transfer chamber 1→the processing chamber PM4→the vacuum transfer chamber 1→the processing chamber PM2 or the processing chamber PM3→the vacuum transfer chamber 1→the load-lock chamber 21→the FOUP3." However, the transfer path of the wafer W is not limited thereto, and may be any path that allows the serial transfer to sequentially and consecutively transfer the wafers to two or more different processing chambers.

In the following description, the vacuum transfer chamber 1 in the transfer path of the wafer W will be omitted. FIG. 2A shows a state in which three wafers are sequentially transferred to the processing chambers PM. First, a first wafer 101 in a lot is transferred in the order of "the FOUP3→the load-lock chamber 21→the processing chamber PM1→the processing chamber PM4→the processing chamber PM2." Next, a second wafer 102 is transferred in the order of "the FOUP3→the load-lock chamber 21→the processing chamber PM1→the processing chamber PM4." Next, a third wafer 103 is transferred in the order of "the FOUP3→the load-lock chamber 21→the processing chamber PM1." A fourth wafer 104 is transferred from the FOUP 4 to the load-lock chamber 21 and waits in the load-lock chamber 21.

Figure 2A:
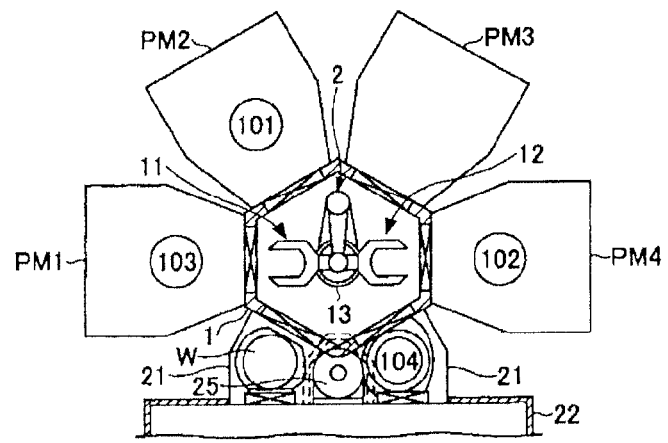
FIGS. 2A to 2C show examples of a serial transfer according to the embodiment.

In this state, when the wafer 103 is in the first processing chamber PM1 as shown in FIG. 2A, the control unit 30 does not perform the transfer of the wafer 104 from the load-lock chamber 21 to the vacuum transfer chamber 1. When there is no wafer 103 in the processing chamber PM1, the control unit 30 performs the transfer of the wafer 104 from the load-lock chamber 21 to the vacuum transfer chamber 1.

In the example of FIG. 2A, when the processing of the wafer 103 is completed in the first processing chamber PM1, the first transfer arm 11 enters the processing chamber PM1 and unloads the processed wafer 103 from the processing chamber PM1. The control unit 30 is notified of the unloading of the wafer W from the processing chamber PM1 by the communication from the substrate transfer device 2. Accordingly, the control unit 30 determines that the wafer has been unloaded from the processing chamber PM1.

Figure 2B:
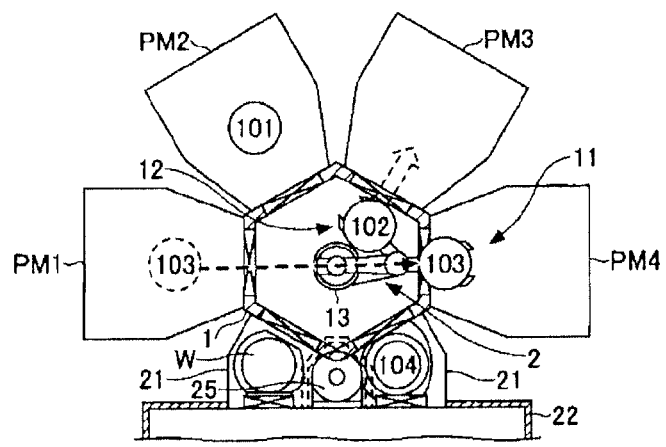

In the example of FIG. 2B, the first transfer arm 11 of the substrate transfer device 2 is rotated by the rotation mechanism 13 about an axis coaxial with the rotation mechanism 13 while holding the wafer 103 and waits in front of the processing chamber PM4 until the processing of the wafer 102 is completed. When the processing of the wafer 102 is completed, the second transfer arm 12 enters the processing chamber PM4 and unloads the processed wafer 102 from the processing chamber PM4. Then, the first transfer arm 11 enters the processing chamber PM4 and loads the wafer 103 into the processing chamber PM4.

The wafer 102 held on the second transfer arm 12 is loaded into an empty processing chamber (the processing chamber PM3 in the example of FIG. 2B) among the processing chamber PM2 and the processing chamber PM3. When neither the processing chamber PM2 nor the processing chamber PM3 is empty, the second transfer arm 12 waits while holding the wafer 102 until one of the processing chambers PM2 and PM3 becomes empty. When the processing in the processing chamber PM2 or the processing chamber PM3 is completed, the processed wafer is unloaded by the first transfer arm 11 from the processing chamber where the processing is completed, and the wafer 102 that has been waiting is loaded thereinto.

Figure 2C:
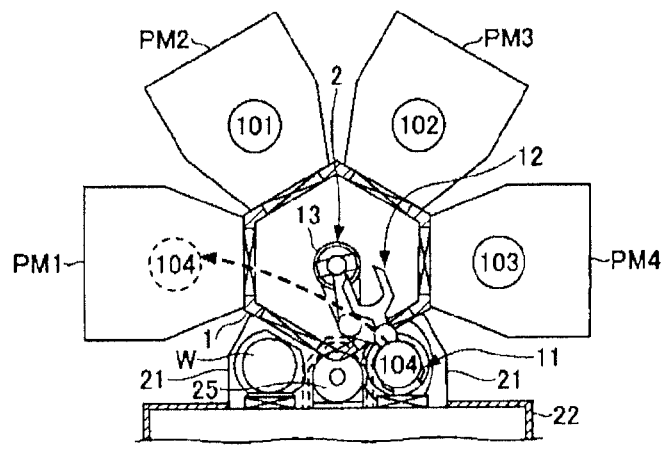

As shown in FIG. 2C, when there is no wafer W in the first processing chamber PM1, the first transfer arm 11 transfers the wafer 104 from the load-lock chamber 21 to the processing chamber PM1 without stopping the transfer operation. At this time, the processed wafer is not held on the second transfer arm 12.

Transfer Sequence

Figure 3:
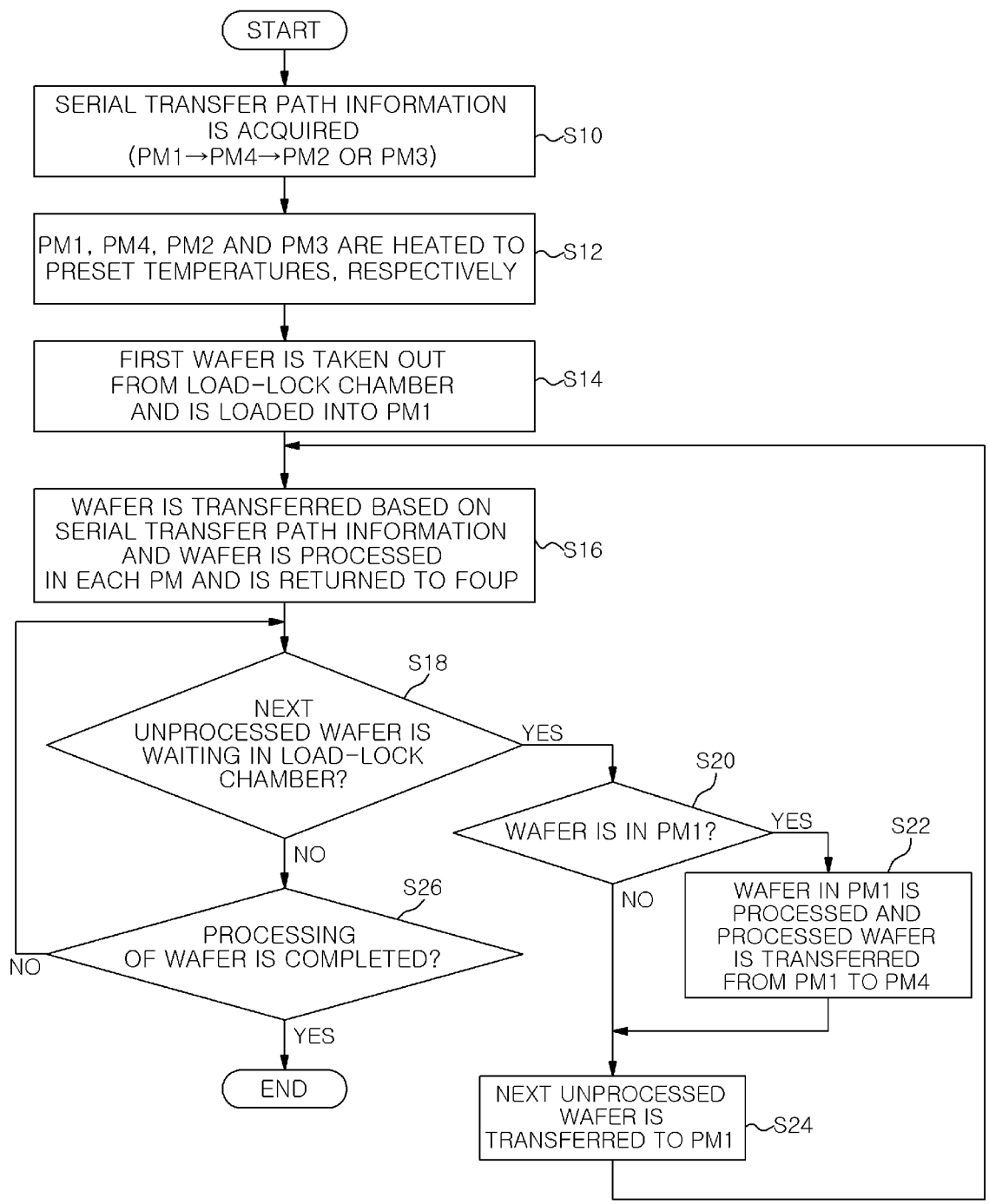
FIG. 3 is a flowchart showing an example of a transfer sequence according to the embodiment.

The transfer operation has been described above. Hereinafter, a transfer sequence performed by the control unit 30 will be described with reference to FIG. 3. FIG. 3 is a flowchart showing an example of the transfer sequence according to the embodiment. As described above, in the substrate processing apparatus 10 according to the embodiment, the wafer W is subjected to the low-temperature processing in the processing chamber PM1 and the high-temperature processing in the processing chamber PM4.

First, the control unit 30 acquires transfer path information for the serial transfer from the memory (step S10). In this example, the transfer path information for the serial transfer of the wafer W to multiple different processing chambers PM, i.e., "the processing chamber PM1→the processing chamber PM4→the processing chamber PM2 or the processing chamber PM3," is acquired. However, the transfer path is not limited thereto, and it may be unnecessary for the wafer W to be transferred to the processing chamber PM2 or the processing chamber PM3.

Next, the control unit 30 controls temperatures of the processing chambers PM1, PM4, PM2, and PM3 on the transfer path such that the processing chambers PM1, PM4, PM2, and PM3 are heated to preset temperatures, respectively (step S12). For example, the processing chamber PM1 may be heated to about 30° C. The processing chamber PM4 may be heated to be in a range of about 150° C. to 200° C. The processing chambers PM2 and PM3 may be heated to be in a range of about 400° C. to about 500° C. After all the processing chambers are controlled to the predetermined temperatures, the transfer of the wafer after step S14 is started. When the FOUP 3 mounted on the load port 23 shown in FIG. 1 is pressed toward the atmospheric transfer chamber 22 side by the pressing mechanism 3a, the opening/closing door on the sidewall of the atmospheric transfer chamber 22 is opened together with the lid of the FOUP 3. Next, the first wafer 101 is taken out from the FOUP 3 and loaded into the load-lock chamber 21 by the atmospheric transfer arm 24. After the load-lock chamber 21 is hermetically closed to switch an inner atmosphere from the atmospheric atmosphere to the vacuum atmosphere, the gate valve G on the vacuum transfer chamber 1 side in the load-lock chamber 21 is opened. Then, the first wafer 101 is taken out from the load-lock chamber 21 and loaded into the processing chamber PM1 by the first transfer arm 11 (step S14).

After the low-temperature processing (e.g., the COR processing) is performed on the wafer 101 in the processing chamber PM1, the control unit 30 performs the transfer of the wafer 101 to the processing chamber PM4 based on the acquired serial transfer path information and performs the high-temperature processing (e.g., the PHT processing) thereon. Thereafter, the wafer 101 is transferred to the processing chamber PM2 or the processing chamber PM3 and subjected to predetermined film formation. The wafers W processed in the processing chambers PM are returned from the load-lock chamber 21 to the FOUP 3 (step S16).

The control unit 30 determines whether or not a next unprocessed wafer 102 is waiting in the load-lock chamber 21 (step S18). When the next unprocessed wafer 102 is waiting in the load-lock chamber 21, the control unit 30 determines whether or not there is a wafer in the first processing chamber PM1 (step S20).

When it is determined that the wafer is in the first processing chamber PM1, the control unit 30 waits until the processing of the wafer in the processing chamber PM1 is completed. When the processing is completed, the control unit 30 performs the transfer of the processed wafer from the processing chamber PM1 to the processing chamber PM4 using the first transfer arm 11 or the second transfer arm 12 (step S22).

On the other hand, when it is determined in step S20 that there is no wafer in the first processing chamber PM1, the control unit 30 immediately performs the transfer of the next unprocessed wafer 102 from the load-lock chamber 21 to the processing chamber PM1 (step S24). Then, the process returns to step S16, and step S16 and subsequent steps are repeated. When it is determined in step S18 that there is no next unprocessed wafer waiting in the load-lock chamber 21 and it is determined that the processing of the wafer W is completed (step S26), the present processing is terminated.

In accordance with the present embodiment, as shown in FIG. 2A, for example, when the wafer 103 is in the first processing chamber PM1, the next unprocessed wafer 104 waits in the load-lock chamber 21 without being transferred from the load-lock chamber 21 to the vacuum chamber 1.

On the other hand, as shown in FIG. 2C, for example, when there is no wafer 103 in the first processing chamber PM 1, the unprocessed wafer 104 in the load-lock chamber 21 is transferred to the processing chamber PM1 without stopping the transfer operation in the vacuum transfer chamber 1.

Thus, in the transfer method according to the present embodiment, either the first transfer arm 11 or the second transfer arm 12 having a high temperature does not wait until the processing of the wafer in the first processing chamber is completed while holding the next unprocessed wafer. Accordingly, the effect of the heat on the unprocessed wafer W from the first transfer arm 11 or the second transfer arm 12 having a high temperature can be minimized. As a result, the influence on the processing results of the unprocessed wafer W can be minimized.

In addition, the variation caused by the effect of the heat on the wafers in the same lot can be minimized. For example, when the first wafer is transferred, the first transfer arm 11 and the second transfer arm 12 do not exchange heat with the processed wafer W or the high-temperature processing chamber PM4. Thus, the temperatures of the first transfer arm 11 and the second transfer arm 12 do not increase. Therefore, the effect of the heat on the first wafer from the transfer arm is almost zero or very small (if it exists). On the other hand, the second and subsequent wafers are transferred while being held on the first transfer arm 11 and the second transfer arm 12 that have exchanged heat with the previously processed wafer or the high-temperature processing chamber PM4. Therefore, the effect of the heat on the second and subsequent wafers is greater than that on the first wafer.

Accordingly, the processing results such as the uniformity of the film, the resistance value of the wafer, and the like may vary among the wafers W in the same lot, which may result in a non-uniform processing state of the wafers W. In view of the above, in the transfer method of the present embodiment, when there is a wafer in the first processing chamber PM1, an unprocessed wafer is not transferred from the load-lock chamber 21 to the vacuum transfer chamber 1. Further, when there is no wafer in the first processing chamber PM1, an unprocessed wafer is unloaded from the load-lock chamber 21 and immediately transferred to the processing chamber PM1 without stopping the transfer operation. Hence, it is possible to minimize the effect of the heat on the unprocessed wafer from the first transfer arm 11 and the second transfer arm 12 during the transfer operation. Accordingly, the variation caused by the effect of the heat on the wafers in the same lot can be minimized.

As described above, the transfer method of the present embodiment includes the process of heating the processing chambers PM on the transfer path to the predetermined temperatures (step S12 in FIG. 3, first step), the process of receiving the processed wafer W from the processing chamber PM1 and transferring the processed wafer W to the processing chamber PM4 using the substrate transfer device 2 (step S22 in FIG. 3, second step), the process of receiving the unprocessed wafer W from the load-lock chamber 21 and transferring the unprocessed wafer W to the processing chamber PM1 using the substrate transfer device 2 (step S24 in FIG. 3, third step).

The second step and the third step are repeatedly performed on each wafer W. The second step is executed prior to the third step. In the example of FIG. 2B, in the second step, the processed wafer 103 is unloaded from the processing chamber PM1 by the first transfer arm 11. When the wafer 102 is present in the processing chamber PM4, the first transfer arm 11 waits while holding the wafer 103. When the processing is completed in the processing chamber PM4, the processed wafer 102 is unloaded from the processing chamber PM4 by the second transfer arm 12, and the wafer 103 is loaded into the processing chamber PM4.

Thereafter, the operation of the first transfer arm 11 is started immediately. As shown in FIG. 2C, the wafer 104 is unloaded from the load-lock chamber 21 and transferred to the processing chamber PM1. At this time, the waiting time for the first transfer arm 11 or the second transfer arm 12 hardly occurs in front of the load-lock chamber 21 before the wafer 104 is unloaded from the load-lock chamber 21.

Therefore, the third step is executed when there is no wafer in the processing chamber PM1 as shown in FIG. 2C, and thus the unprocessed wafer 104 can be transferred from the load-lock chamber 21 to the processing chamber PM1 without stopping the transfer operation.

As a result, the period of time for holding the unprocessed wafer W on the first transfer arm 11 or the second transfer arm 12 can be minimized, and thus the effect of the heat on the unprocessed wafer W from the first transfer arm 11 and the second transfer arm 12 can be minimized. Consequently, it becomes possible to minimize the influence on the processing results of the unprocessed wafer W.

The transfer method according to the embodiment of the present disclosure is merely an example in all aspects and is not intended to limit the present disclosure. The above embodiment can be variously changed and modified without departing from the scope and spirit of the claims. The contents described in the above embodiments can be implemented in other embodiments without contradicting each other and can be combined without contradicting each other.

The processing chamber PM of the present disclosure can be applied to any type of capacitively coupled plasma (CCP), inductively coupled plasma (ICP), radial line slot antenna (RLSA), electron cyclotron resonance plasma (ECR), and helicon wave plasma (HWP).

In the present disclosure, the wafer W has been described as an example of the substrate. However, the substrate is not limited thereto, and may be various substrates used in a flat panel display (FPD), a printed circuit board, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A transfer method used in a substrate processing apparatus, wherein the substrate processing apparatus includes a vacuum transfer chamber maintained in a vacuum state, a first processing chamber, a second processing chamber and a preliminary chamber that are connected to the vacuum transfer chamber, and a substrate transfer device disposed in the vacuum transfer chamber to transfer substrates between the first processing chamber, the second processing chamber, and the preliminary chamber, and the transfer method repeatedly performs a process of transferring each of the substrates unloaded from the preliminary chamber sequentially and consecutively to the first processing chamber and the second processing chamber, the transfer method comprising:
   a first step of heating the first processing chamber and the second processing chamber such that a temperature of the first processing chamber becomes lower than a temperature of the second processing chamber;
   a second step of unloading a processed substrate from the first processing chamber and transferring the processed substrate to the second processing chamber using the substrate transfer device; and
   a third step of transferring an unprocessed substrate from the preliminary chamber to the first processing chamber using the substrate transfer device,
   wherein the second step and the third step are repeatedly executed for each of the substrates,
   the third step includes: a step of having the unprocessed substrate wait in the preliminary chamber without transferring the unprocessed substrate from the preliminary chamber to the first processing chamber, when there is any substrate in the first processing chamber; and
   a step of transferring the unprocessed substrate from the preliminary chamber to the first processing chamber without stopping a transfer operation, when no substrate is mounted in the first processing chamber, and
   a period of time in which the unprocessed substrate is held in the vacuum transfer chamber is minimized to prevent heating of the unprocessed substrate prior to being transferred into the first processing chamber.

2. The transfer method of claim 1, wherein the second step is executed prior to the third step.

3. The transfer method of claim 2, wherein the substrate transfer device has two transfer arms.

4. The transfer method of claim 3, wherein in the third step, one of the two transfer arms of the substrate transfer device receives the unprocessed substrate from the preliminary chamber and transfers the unprocessed substrate to the first processing chamber while the other one of the two transfer arms holds no substrate.

5. The transfer method of claim 2, wherein the substrate transfer device receives heat when each of the substrates is transferred to and from the second processing chamber.

6. The transfer method of claim 1, wherein the substrate transfer device has two transfer arms.

7. The transfer method of claim 6, wherein in the third step, one of the two transfer arms of the substrate transfer device receives the unprocessed substrate from the preliminary chamber and transfers the unprocessed substrate to the first processing chamber while the other one of the two transfer arms holds no substrate.

8. The transfer method of claim 7, wherein the substrate transfer device receives heat when each of the substrates is transferred to and from the second processing chamber.

9. The transfer method of claim 1, wherein the substrate transfer device receives heat when each of the substrates is transferred to and from the second processing chamber.

* * * * *